(12) United States Patent
Yang

(10) Patent No.: US 9,689,927 B2
(45) Date of Patent: Jun. 27, 2017

(54) DETECTION CIRCUIT AND ELECTRONIC TERMINAL

(75) Inventor: Liang Yang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 139 days.

(21) Appl. No.: 14/394,990

(22) PCT Filed: Jul. 13, 2012

(86) PCT No.: PCT/CN2012/078622
§ 371 (c)(1),
(2), (4) Date: Oct. 22, 2014

(87) PCT Pub. No.: WO2013/155801
PCT Pub. Date: Oct. 24, 2013

(65) Prior Publication Data
US 2015/0123668 A1 May 7, 2015

(30) Foreign Application Priority Data

Apr. 19, 2012 (CN) .......................... 2012 1 0118173

(51) Int. Cl.
*H01M 10/46* (2006.01)
*G01R 31/36* (2006.01)
(Continued)

(52) U.S. Cl.
CPC ......... *G01R 31/3648* (2013.01); *G01R 21/06* (2013.01); *G01R 31/36* (2013.01);
(Continued)

(58) Field of Classification Search
CPC ...... H02J 7/0026; H02J 7/0021; H02J 7/0047; H02J 2007/005
(Continued)

(56) References Cited

U.S. PATENT DOCUMENTS 6,157,169 A * 12/2000 Lee ................. G01R 19/16542
320/130
6,172,481 B1 1/2001 Curtiss
(Continued)

FOREIGN PATENT DOCUMENTS

CN 1228540 9/1999
CN 101126796 2/2008
(Continued)

OTHER PUBLICATIONS

English translation of the abstract for CN 101126796 published Feb. 20, 2008.
(Continued)

*Primary Examiner* — Edward Tso
(74) *Attorney, Agent, or Firm* — Thomas Horstemeyer, LLP

(57) ABSTRACT

Disclosed are a detection circuit and an electronic terminal. The detection circuit is applied in the electronic terminal and configured to detect a real-time working current of the electronic terminal. The circuit comprises: a resistor, having two ends and with variable resistance values; a sampling unit, configured to be connected with both ends of the resistor and collect voltages at both ends of the resistor; a first memory, configured to store a current calculating method and an electric quantity calculating method; a data processing control unit, configured to be connected with the sampling unit and the first memory, calculate a voltage difference across the resistor according to the voltages, and call above calculating methods to acquire a current value and an electric quantity value according to the voltage difference and the resistance value; and a power supply device, configured to provide a stable power supply for the detection circuit.

14 Claims, 2 Drawing Sheets

(51) Int. Cl.
  *G01R 21/06* (2006.01)
  *G01R 1/20* (2006.01)
  *G01R 15/08* (2006.01)
  *H01M 10/48* (2006.01)

(52) U.S. Cl.
  CPC .......... *G01R 31/3606* (2013.01); *G01R 1/203* (2013.01); *G01R 15/08* (2013.01); *H01M 10/48* (2013.01)

(58) Field of Classification Search
  USPC ...... 320/107, 132, 149, DIG. 21; 340/636.1, 340/636.12, 636.13, 636.15, 636.16, 340/636.19; 702/62, 63, 64
  See application file for complete search history.

(56) References Cited

U.S. PATENT DOCUMENTS

| | | | |
|---|---|---|---|
| 6,424,157 B1 * | 7/2002 | Gollomp | G01R 31/006 320/132 |
| 2004/0025322 A1 * | 2/2004 | Binnard | G03F 7/707 29/592.1 |
| 2005/0151543 A1 | 7/2005 | Taylor | |
| 2009/0251326 A1 | 10/2009 | Kim et al. | |
| 2010/0085034 A1 | 4/2010 | Sakayori | |
| 2010/0198537 A1 | 8/2010 | Takemori | |
| 2012/0029851 A1 | 2/2012 | Nakayama et al. | |

FOREIGN PATENT DOCUMENTS

| | | |
|---|---|---|
| CN | 101153894 | 4/2008 |
| CN | 201821092 | 5/2011 |
| JP | 2010019653 | 1/2010 |

OTHER PUBLICATIONS

English translation of the abstract for CN 101153894 published Apr. 2, 2008.
English translation of the abstract for CN 1228540 published Sep. 15, 1999.
English translation of the abstract for JP 2010019653 published Jan. 28, 2010.
English translation of the abstract for CN 201821092 published May 4, 2011.

* cited by examiner

DETECTION CIRCUIT AND ELECTRONIC TERMINAL

CROSS-REFERENCE TO RELATED APPLICATIONS

This application is the 35 U.S.C. §371 national stage of PCT Application No. PCT/CN2012/078622, filed Jul. 13, 2012, which is herein incorporated by reference in its entirety and which also claims priority to, and the benefit of, Chinese Patent Application No. 201210118173.4, filed Apr. 19, 2012, which is herein incorporated by reference in its entirety.

TECHNICAL FIELD

The present document relates to the field of electronic technology, and more particularly, to a detection circuit and an electronic terminal.

BACKGROUND OF THE RELATED ART

With continuous development of electronic technology, there are more and more cases that users use mobile communication devices to watch multimedia, play games or browse the Internet, for example, in the case of using an electronic terminal to watch multimedia, play games or browse the Internet, the user pays attention to whether a remaining battery capacity of the electronic terminal can support the user to watch multimedia, playing games or browsing the Internet or not, while the current electronic terminal displays the battery power in the form of the number of icon grids or a percentage, which is very impractical for the user. For example, when a user uses an electronic terminal to watch an online movie or network TV, what the user actually cares about is whether the current battery can support him/her to finish the current program or not, without caring how much the battery power is left currently.

When the electronic terminal provides the user with an accurate remaining time, it must meet two requirements, one is an accurate calculation of the remaining capacity of the system power supply, and the other is an accurate detection of a system working current.

Currently, the electronic terminal mainly has the following two schemes to solve the abovementioned two problems:

one scheme is to use a fitting algorithm to estimate the battery capacity depending on to the battery voltage and battery temperature, but for this scheme, an error is relatively large and it is not suitable for applications with high-precision.

The other scheme is to add a sampling resistor in the charging and discharging circuit of the battery, and depending on the system charging and discharging current and the battery temperature acquired from the sampling resistor, and an integral algorithm is used to calculate the battery capacity. With this scheme, the working current range of this sampling resistor must be limited between 5 mA~2 A, according to the Ohm's law, when maintaining the working voltage of the electronic terminal within the range, the sampling resistor generally uses a resistor with fixed resistance value of 5 milliohms~100 milliohms, if increasing the resistance value of the sampling resistor at this time, the system power consumption increases correspondingly, which has a great effect on the current accuracy, however, if the current accuracy is not good enough, it greatly affects the accuracy of the calculated electric quantity, and the accuracy of the calculated electric quantity is not good enough.

SUMMARY OF THE INVENTION

The present document provides a detection circuit and an electronic terminal, to solve the technique problem that an error of battery capacity measurement is relatively large and the accuracy is not good enough.

On one hand, the present document provides the following technical solution through an embodiment of the present application:

a detection circuit, used in an electronic terminal and configured to: detect a real-time working current of the electronic terminal, wherein the circuit comprises:

a resistor, configured to: comprise a first end and a second end, wherein a resistance value of the resistor is variable;

a sampling unit, configured to: be connected to both ends of the resistor, and collect voltages at the both ends of the resistor;

a first memory, configured to: store a current calculating method and an electric quantity calculating method;

a data processing control unit, configured to: be connected with the sampling unit and the first memory, calculate a voltage difference between the both ends of the resistor based on the voltages at the both ends of the resistor, and call the current calculating method and the electric quantity calculating method, according to the voltage difference and the resistance value of the resistor, acquire a current value and an electric quantity value;

a power supply device, configured to: provide a stable power supply for the detection circuit.

Alternatively, the circuit further comprises a calculating unit, configured to: based on the current calculating result and the electric quantity calculating result, acquire a remaining working time of the electronic terminal.

Alternatively, the sampling unit comprises: a first sampling unit, configured to: be connected between the first end of the resistor and the data processing control unit, and sample a voltage value at the first end; a second sampling unit, configured to: be connected between the second end of the resistor and the data processing control unit, and sample the voltage value at the second end.

Alternatively, the circuit further comprises: a second memory, configured to: store a threshold value.

Alternatively, the circuit further comprises a configuration unit, configured to: be connected with the second memory and the data processing control unit respectively, compare the threshold value with the voltage difference, and when the voltage difference is greater than the threshold value, adjust the resistance value of the resistor so that the voltage difference is less than or equal to the threshold value.

Alternatively, the circuit further comprises a temperature sensor, configured to: be connected with the power supply device, and collect a temperature of the power supply device.

Alternatively, the data processing control unit is configured to: based on the temperature, the voltage difference, and the resistance value, use the current calculating method and the electric quantity calculating method to calculate, so as to acquire the current value and the electric quantity value.

On the other hand, the present document provides an electronic terminal through another embodiment of the present application, and the electronic terminal comprises:

a baseband module, configured to: control normal operation of the electronic terminal;

a detection module, configured to: detect a remaining working time of the electronic terminal;

a data interface module, configured to: transport the remaining working time of the electronic terminal to the baseband module.

Alternatively, the electronic terminal further comprises a power supply module that is configured to provide a stable power supply for the electronic terminal.

PREFERRED EMBODIMENTS OF THE INVENTION

In order to solve the technical problem that the error of battery capacity measurement is relatively large and the accuracy is not good enough, the embodiment of the present document provides a detection circuit and an electronic terminal, and in the following, in combination with the accompanying drawings, the main implementation principles, the specific implementation process and its corresponding achievable beneficial effects of the embodiment of the present document will be described in detail.

The First Embodiment

Figure 1:
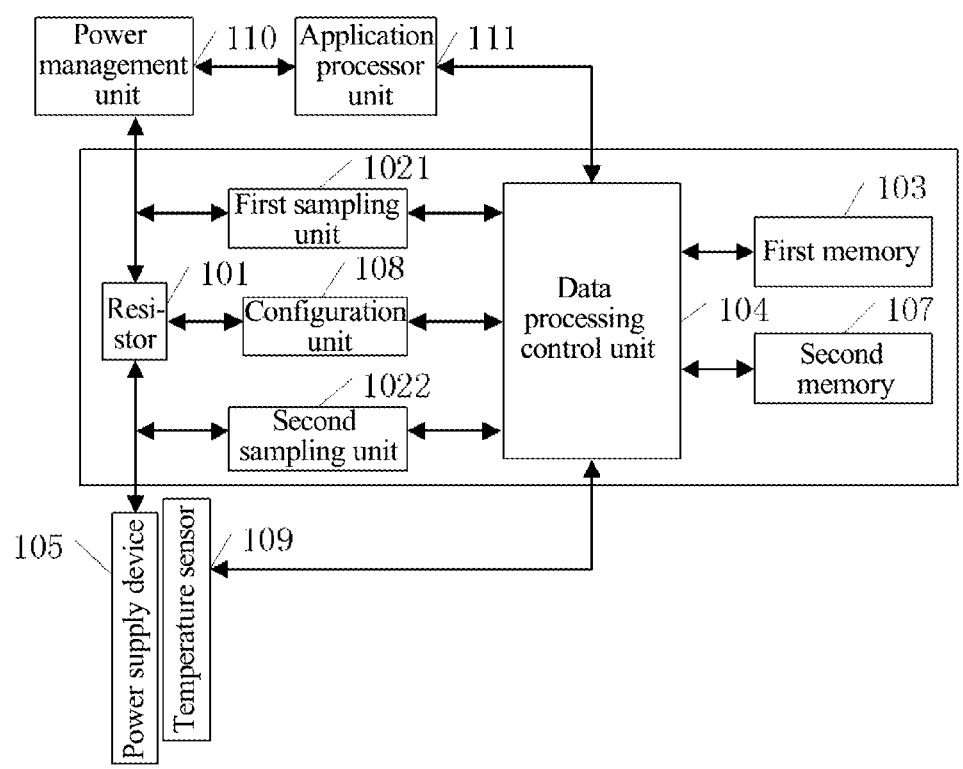
FIG. 1 is a functional block diagram of a detection circuit in accordance with an embodiment of the present application.

In the present embodiment, referring to FIG. 1, FIG. 1 describes a detection circuit used in an electronic terminal, and used to detect a real-time working current of the electronic terminal, by connecting in series a variable resistor 101 in a discharging circuit of the power supply, by measuring the voltages at both ends of the resistor 101, and through a series of calculating methods, the current and the electric quantity is calculated, and then the remaining battery capacity and the accurate remaining working time are calculated.

In the following, the circuit will be described in detail, comprising: a resistor 101, a sampling unit, a first memory 103, and a data processing control unit 104. Wherein:

the resistor 101 comprises a first end and a second end, wherein the resistance value of the resistor 101 is variable.

the sampling units are connected at both ends of the resistor 101, and are used to collect the voltages at both ends of the resistor 101. The sampling units generally comprise two sampling units, that is, a first sampling unit 1021 and a second sampling unit 1022, and both sampling units are connected with the two ends of the resistor 101. For example, the first sampling unit 1021 is connected between the first end of the resistor 101 and the data processing control unit 104, and is used to sample the voltage value at the first end; the second sampling unit 1022 is connected between the second end of the resistor 101 and the data process control unit 104, and samples the voltage value at the second end. The voltage values collected by the first sampling unit 1021 and the second sampling unit 1022 are transported to the data processing control unit 104 to calculate.

the first memory 103 is used to store the current calculating method and the electric quantity calculating method. Wherein, these two methods are transported to the data processing control unit 104, while in practical applications, there are many current calculating methods and electric quantity calculating methods, and the specific choices of which method would be used as well as the first memory 103 is used to store which calculating method depend on practical applications, and the present application does not apply any restrictions.

The data processing control unit 104 is connected with the sampling unit and the first memory 103, and is used to calculate the voltage difference across the resistor 101 according to the voltages at both ends of the resistor 101, and call a current calculating method and an electric quantity calculating method, and acquire a current value and a power value based on the voltage difference as well as the resistance value of the resistor 101.

The power supply device 105 is used to provide a stable power for the detection circuit.

In the present embodiment, besides the abovementioned components, the detection circuit further comprises a calculating unit, second memory 107, a configuration unit 108, and a temperature sensor 109.

Wherein the calculating unit is used to calculate a remaining working time of the electronic terminal based on the current calculating result and the electric quantity calculating result.

while the second memory 107 is used to store a threshold value.

The configuration unit 108 is connected with the second memory 107 and the data processing control unit 104 respectively, and is used to compare the threshold value with the voltage difference, when the voltage difference is greater than the threshold value, adjust the resistance value of the resistor 101 so that the voltage difference is less than or equal to the threshold value.

The temperature sensor 109 is connected with the power supply device 105, and is used to collect the temperature of the power supply device 105.

Furthermore, with the support of the abovementioned components, the data processing control unit 104 is specifically configured to, based on the temperature, the voltage difference and the resistance value of the resistor 101, use the current calculating method and the electric quantity calculating method to calculate, so as to acquire a current value and an electric quantity value.

The function of each component in the detection circuit is described above, and more particularly, FIG. 1 describes the connection relationship between the respective components described above, in this embodiment, in addition to the components described above, in order to ensure the stability of the detection circuit, it further adds some more components, as shown in FIG. 1:

the power supply device 105 is connected with the power management unit 110 through the resistor 101, and the power management unit 110 is used to manage the power supply of the overall system, and is connected with application processor unit 111, and is managed by the application processor unit 111, moreover, the application processor unit 111 is connected with the data processing control unit 104, and is subjected to the control of the data processing control unit 104.

For the resistor 101, the resistor 101 is connected with the data processing control unit 104 through the configuration unit 108, and both ends of the resistor 101 are respectively connected with the data processing control unit 104 through the first sampling unit 1021 and the second sampling unit 1022, and is used to collect the voltage values at both ends of the resistor 101 in real time.

The current calculating method and the electric quantity calculating method are stored in the first memory 103, the threshold value is stored in the second memory 107, and the first memory 103 and the second memory 107 are connected with the data processing control unit 104.

In addition, the temperature sensor 109 is also connected with the data processing control unit 104.

The data processing control unit 104 calculates the difference of the collected voltages of the two ends of the variable resistor 101 in real time through the first sampling unit 1021, and compares it with the threshold value in the second memory 107, and if it is out of the range, adjusts the resistance value of the resistor 101 through the configuration unit 108, so that the voltage difference calculated by the data processing control unit 104 is always maintained in a high precision range. Then the temperature sensing unit collects the temperature of the power supply device 105, and according to the voltage difference calculated by the data processing control unit 104 and the configured resistance value of the resistor 101, together with the current calculating method and the electric quantity calculating algorithm, the accurate real-time current value and the electric quantity of the power supply device 105 are acquired.

Figure 2:
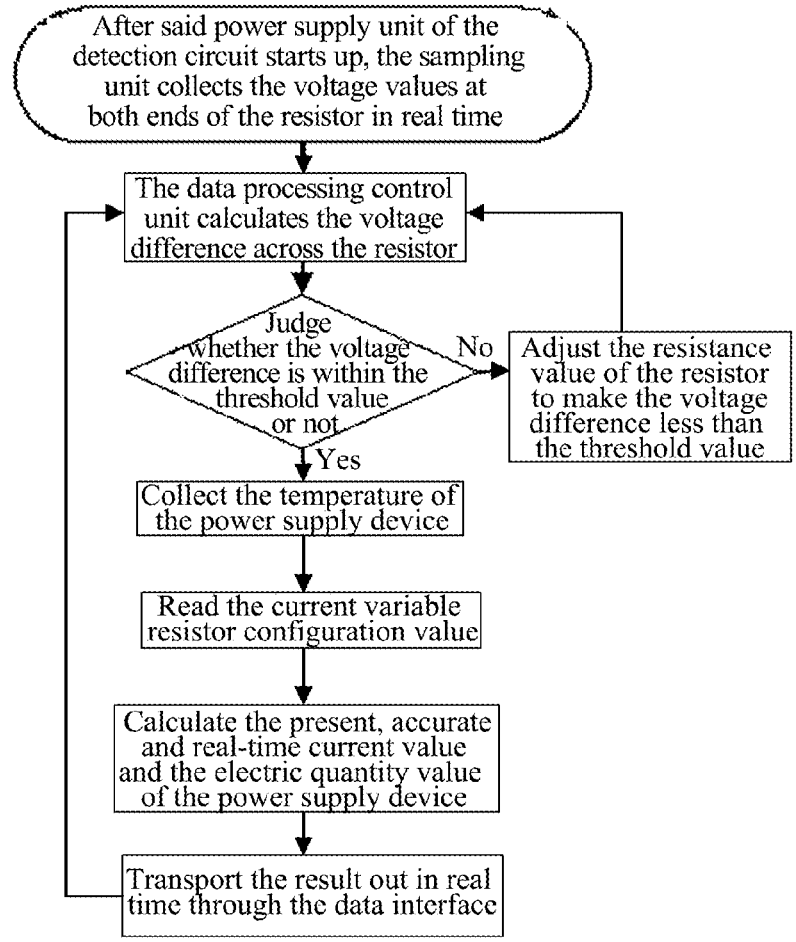
FIG. 2 is an architectural diagram of a detection circuit in accordance with an embodiment of the present application.

The specific work mode of the detection circuit will be described in detail in the following, as shown in FIG. 2:

after the power supply unit 105 of the detection circuit starts up, the sampling unit collects the voltage values at both ends of the resistor 101 in real time.

Then the data processing control unit 104 calculates the voltage difference across the resistor 101.

The configuration unit 108 compares the voltage difference with the threshold value stored in the second storage unit, and judges whether the voltage difference is within the threshold value or not, if the voltage difference is greater than the threshold value, adjusts the resistance value of the resistor 101 to make the voltage difference less than the threshold value, then transmits it to the data processing control unit 104; if the voltage difference is less than the threshold value, adjusts the resistance value of the resistor 101 to make the voltage difference less than the threshold value; if the voltage difference is within the threshold value, no adjustment is needed.

The temperature sensor 109 collects and transfers the temperature of the power supply device 105 to the data processing control unit 104.

The data processing control unit 104 calls the current calculating method and the electric quantity calculating method, according to the voltage difference and the resistance value of the resistor 101, calculates the present accurate real-time current value and the electric quantity value of the power supply device 105, and sends the result out in real time through the data interface, and by doing so back and forth, it can acquire the real-time current value and the electric quantity value of the power supply unit 105.

If it needs to calculate whether the remaining electric quantity can support the system work or not, the system remaining time can be accurately acquired through a simple algorithm (the remaining electric quantity divided by the working current).

For example, when a user opens a certain multimedia file, the system first detects whether the playback time of the multimedia file is greater than the system remaining time or not, if the playback time of the multimedia file is greater than the system remaining time, the system prompts the user that the working time is insufficient in the current mode, and prompts the user whether to continue to play or perform optimization to partially reduce the power consumption, if the playback time of the multimedia file is less than the system remaining time, the system directly plays the multimedia file.

In the present embodiment, the specific structure and the working principle of the detection circuit are described in detail, and the detection circuit may dynamically adjust the resistance value of the resistor 101 based on the real-time change of the system working circuit, it avoids that the too large or too small system working current results in too large or too small voltage difference produced across the resistor 101, and further results in the detection circuit entering into an inaccurate area with a high threshold and an interference-vulnerable region with a low threshold, it ensures to detect the system working current with high precision in real time, and since the power meter measures relying on the power charging circuit and discharging current, after improving the detection accuracy of the current, no doubt it can greatly improve the working accuracy of the power meter.

Figure 3:
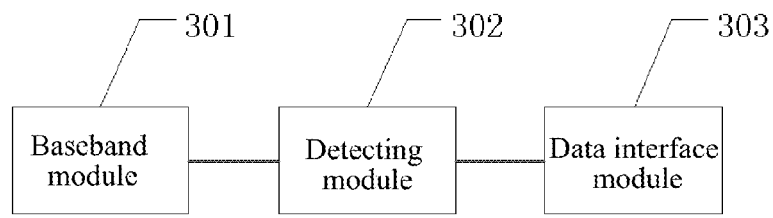
FIG. 3 is a working schematic diagram of a detection circuit in accordance with an embodiment of the present application.

In addition to the abovementioned embodiment, a second embodiment further provides an electronic terminal, and referring to FIG. 3, the electronic terminal comprises:

a baseband module 301, used for controlling a normal operation of the electronic terminal;

a detection module 302, used for detecting a remaining working time of the electric terminal;

a data interface module 303, used for transferring the remaining working time of the electronic terminal to the baseband module 301.

Furthermore, the electronic terminal further comprises a power supply module which is used to provide the electronic terminal with a stable power.

With one or more embodiments of the present document, it can achieve the following technical effects:

in the abovementioned embodiment, by using the resistor 101 with a variable resistance value, the detection circuit can dynamically adjust the resistance value of the resistor 101 based on the real-time change of the system working circuit, which avoids that the too large or too little system working electric quantity results in too large or too small voltage difference across the resistor 101, and further results in the detection circuit entering into an inaccurate area with a high threshold and an interference-vulnerable region with a low threshold, it ensures to detect the system working current with high precision in real time.

Furthermore, because the electric quantity is measured relying on the power charging circuit and the discharging current, after improving the current detection accuracy, no doubt it can greatly improve the working accuracy of the power meter.

Obviously, those skilled in the art may make various changes and modifications of the present document without departing from the spirit and scope of the present document. Thus, if such changes and modifications of the present document belong to the claims of the present document as well as the scope of its technical equivalents, the present document is also intended to include these changes and modifications.

INDUSTRIAL APPLICABILITY

The present technical scheme uses a resistor with a variable resistance value to make the detection circuit dynamically adjust the resistance value of the resistor based on the real-time change of the system working circuit, thus avoiding that too large or too little system working electric quantity results in too large or too small voltage difference across the resistor, and further results in the detection circuit entering into an inaccurate area with a high threshold and an interference-vulnerable region with a low threshold, it ensured to detect the system working current with high precision in real time.

Since the electric quantity is measured relying on the power charging circuit and the discharging current, after improving the current detection accuracy, no doubt it can greatly improve the working accuracy of the power meter.

What is claimed is:

1. A detection circuit, used in an electronic terminal and configured to: detect a real-time working current of the electronic terminal, wherein the circuit comprises:
    a resistor, configured to: comprise a first end and a second end, wherein a resistance value of the resistor is variable;
    a sampling unit, configured to: be connected to both ends of the resistor, and collect voltages at the both ends of the resistor;
    a first memory, configured to: store a current calculating algorithm and an electric quantity calculating algorithm;
    a data processing control unit, configured to: be connected with the sampling unit and the first memory, calculate a voltage difference between the both ends of the resistor based on the voltages at the both ends of the resistor, and call the current calculating algorithm and the electric quantity calculating algorithm, according to the voltage difference and the resistance value of the resistor, acquire a current value and an electric quantity value; and
    a power supply device, configured to: provide a stable power supply for the detection circuit.

2. The circuit of claim 1, wherein, the circuit further comprises a calculating unit, configured to: based on the current calculating result and the electric quantity calculating result, acquire a remaining working time of the electronic terminal.

3. The circuit of claim 1, wherein, the sampling unit comprises:
    a first sampling unit, configured to: be connected between the first end of the resistor and the data processing control unit, and sample a voltage value at the first end; and
    a second sampling unit, configured to: be connected between the second end of the resistor and the data processing control unit, and sample a voltage value at the second end.

4. The circuit of claim 1, wherein, the circuit further comprises:
    a second memory, configured to: store a threshold value.

5. The circuit of claim 4, wherein, the circuit further comprises a configuration unit, configured to: be connected with the second memory and the data processing control unit respectively, compare the threshold value with the voltage difference, and when the voltage difference is greater than the threshold value, adjust the resistance value of the resistor so that the voltage difference is less than or equal to the threshold value.

6. The circuit of claim 1, wherein, the circuit further comprises a temperature sensor, configured to: be connected with the power supply device, and collect a temperature of the power supply device.

7. The circuit of claim 6, wherein, the data processing control unit is configured to: based on the temperature, the voltage difference, and the resistance value, use the current calculating algorithm and the electric quantity calculating algorithm to calculate, so as to acquire the current value and the electric quantity value.

8. An electronic terminal, wherein, the electronic terminal comprises:
    a baseband module, configured to: control normal operation of the electronic terminal;
    a detection circuit according to claim 2; and
    a data interface module, configured to: transport the remaining working time of the electronic terminal to the baseband module.

9. The electric terminal of claim 8, wherein, the electronic terminal further comprises a power supply module that is configured to provide a stable power supply for the electronic terminal.

10. An electronic terminal, wherein, the electronic terminal comprises:
    a baseband module, configured to: control normal operation of the electronic terminal;
    a detection circuit according to claim 3; and
    a data interface module, configured to: transport the remaining working time of the electronic terminal to the baseband module.

11. An electronic terminal, wherein, the electronic terminal comprises:
    a baseband module, configured to: control normal operation of the electronic terminal;
    a detection circuit according to claim 4; and
    a data interface module, configured to: transport the remaining working time of the electronic terminal to the baseband module.

12. An electronic terminal, wherein, the electronic terminal comprises:
    a baseband module, configured to: control normal operation of the electronic terminal;
    a detection circuit according to claim 5; and
    a data interface module, configured to: transport the remaining working time of the electronic terminal to the baseband module.

13. An electronic terminal, wherein, the electronic terminal comprises:
    a baseband module, configured to: control normal operation of the electronic terminal;
    a detection circuit according to claim 6; and
    a data interface module, configured to: transport the remaining working time of the electronic terminal to the baseband module.

14. An electronic terminal, wherein, the electronic terminal comprises:
    a baseband module, configured to: control normal operation of the electronic terminal;
    a detection circuit according to claim 7; and
    a data interface module, configured to: transport the remaining working time of the electronic terminal to the baseband module.

* * * * *